United States Patent [19]

Makishima et al.

[11] Patent Number: 4,884,011
[45] Date of Patent: Nov. 28, 1989

[54] LIGHT-DETECTING DEVICE

[75] Inventors: Tatsuo Makishima, Mitaka; Tadaaki Hirai, Koganei; Kazutaka Tsuji, Hachioji, all of Japan; Sachio Ishioka, Burlingame, Calif.; Takashi Yamashita, Sagamihara; Keiichi Shidara, Tama, both of Japan; Junichi Yamazaki, Kawasaki; Masaaki Aiba, Tokyo, both of Japan

[73] Assignee: Hitachi, Ltd. & Nippon Hoso Kasai, Tokyo, Japan

[21] Appl. No.: 143,384

[22] Filed: Jan. 13, 1988

[30] Foreign Application Priority Data

Jan. 14, 1987 [JP] Japan .................. 62-4868

[51] Int. Cl.$^4$ .............................................. H04N 3/14
[52] U.S. Cl. .................. 315/368; 358/213.15; 313/385
[58] Field of Search ............. 358/213.11, 213.16, 358/213.31; 313/384, 385; 315/368

[56] References Cited

U.S. PATENT DOCUMENTS

| 4,040,985 | 8/1977 | Shidara et al. | 313/385 |
| 4,614,891 | 9/1986 | Kuwahata et al. | 313/385 |
| 4,748,506 | 5/1988 | Hieda | 358/213.15 |

FOREIGN PATENT DOCUMENTS 4318643 8/1968 Japan.
4924619 3/1974 Japan.

OTHER PUBLICATIONS

1985 National Convention Record of ITE of Japan, pp. 25-26.

Primary Examiner—Thomas H. Tarcza
Assistant Examiner—David Cain
Attorney, Agent, or Firm—Antonelli, Terry & Wands

[57] ABSTRACT

A light-detecting device for converting a light to an electrical signal utilizes a charge multiplication function and has a stable gain.

The light-detecting device comprises a photo-electric conversion unit for converting a measurement light to an electrical signal, a power supply for applying an electric field to the photo-electric conversion unit, a light source for applying an incident light to the photo-electric conversion unit, signal detection means for detecting the charge converted by the photo-electric conversion unit based on the incident light from the light source, and signal hold means for holding the output signal of the signal detection means at a predetermined level.

23 Claims, 6 Drawing Sheets

LIGHT-DETECTING DEVICE

BACKGROUND OF THE INVENTION

1. FIELD OF THE INVENTION

The present invention relates to a light-detecting device for converting a light to an electrical signal, and more particularly to a light-detecting device which internally multiplies charges by making use of an effect of an externally applied electric field to enhance a sensitivity.

The light-detecting device of the present invention includes one which converts an incident light to an electrical signal and multiplies charges by making use of an electric field effect by an externally applied electric field to enhance a sensitivity. Such photo sensitive device may include an avalanche photo-diode (APD), a photo-multiplier tube, an image intensifier type image pick-up tube, and a photo-conductive image pick-up tube.

2. RELATED BACKGROUND ART

In a prior art light-detecting device such as a photo-conductive image pick-up tube disclosed in JP-A-49-24619, a blocking type target is used to block charge injection from a signal electrode and scanning electron beam side. This type of light-detecting device has an advantage of small lag. However, in image pick-up tube having a blocking type target which has a gain larger than unity and a high sensitivity has not been known.

An image pick-up tube which uses an injection type target in which charges are injected from both or one of the signal electrode and the scanning electron beam has been known. In such an image pick-up tube which uses the injection type target, it is possible, in principle, to take out more carriers (electrons) than the number of incident photons to an external circuit and hence an image pick-up tube having larger than unity gain can be provided.

As such image pick-up tubes which uses the injection type targets, a high sensitivity image pick-up tube having a target made of an np single crystal (JP-B-43-18643) and a high sensitivity image pick-up tube having an electron injection recombination layer arranged on a scanning beam side of a photo-conductive layer to allow injection of scanning electrons and recombination of the scanning electrons and holes (1985 National Convention Record of the Institute of Television Engineers of Japan, pages 25 and 26) have been proposed.

However, in such a light-detecting device having the gain increased larger than unity, the sensitivity is highly sensitive to a surrounding environment even if the externally applied voltage is always kept constant. In the photo-conductive image pick-up tube which uses the blocking type target, a portion of the scanning electrons is injected into the target. Accordingly, an effective storage capacity of the target increases, in principle, and the lag increases.

SUMMARY OF THE INVENTION

It is an object of the present invention to provide a light-detecting device which resolves problems encountered in the prior art light-detecting device and operates with a stable and high sensitivity characteristic.

It is another object of the present invention to provide a light-detecting device suitable for a light-detecting device which uses charge multiplication.

It is other object of the present invention to provide a light-detecting device having an excellent lag characteristic.

It is other object of the present invention to provide a light-detecting device which stably converts a measurement light to an electrical signal with high reproducibility.

It is other object of the present invention to provide a light-detecting device whose sensitivity characteristic varies very little with an operational condition of a target other than an applied voltage, such as peripheral temperature, light wavelength or operation time.

In order to achieve the above objects, the light-detecting device of the present invention comprises a photo-electric conversion unit for converting a measurement light to an electrical signal, a power supply for applying an electric field to the photo-electric converter, a light source for directing an incident light to the photo-electric conversion unit, signal detection means for detecting a charge converted by the photo-electric conversion unit in accordance with the incident light from the light source, and signal hold means for holding the output signal of the signal detection means at a predetermined level.

In accordance with the present invention, the light-detecting device can be stably operated with a high reproducibility while the variation of the sensitivity characteristic of the light-detecting device is suspended. When the present invention is applied to the image pick-up tube having the internal multiplication function, there is no variation of a pedestal level and an image signal is provided with a high reproducibility.

DESCRIPTION OF THE PREFERRED EMBODIMENTS

In a photo-electric conversion unit of the light-detecting device, a photo-electric conversion characteristic depends on an intensity of an applied electric field. When the light-detecting device is high sensitivity light-detecting device which uses a charge multiplication function, a relationship between the applied electric field and a signal current by a measured light is very sensitive. Such a light-detecting device is disclosed in U.S. application Ser. No. 69,156 assigned to the assignee of the present invention.

It utilizes a charge multiplication function created in an amorphous semiconductor layer primarily consisting of Se by applying a relatively high electric field to the amorphous semiconductor layer. A relationship between a signal current and an applied electric field strength in such a light-detecting device is explained.

Figure 1:
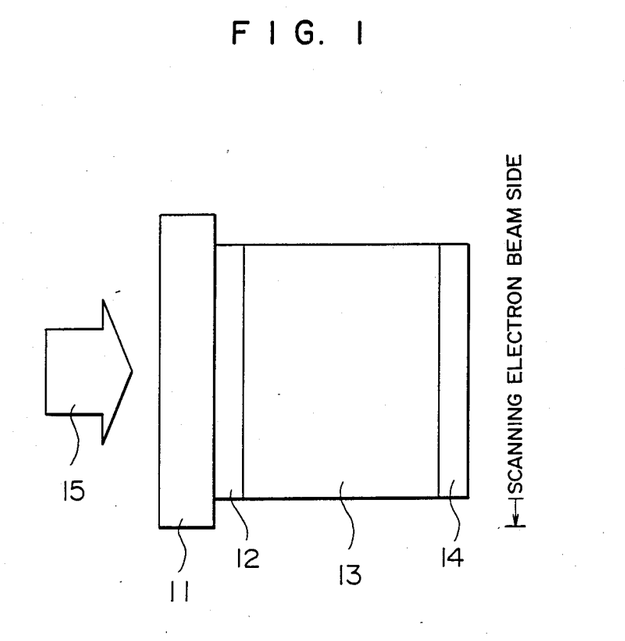
FIG. 1 shows a structure of a photo-conductive image pick-up tube target having a charge multiplication function suitably applicable to a light-detecting device of the present invention.

FIG. 1 shows a structure of an image pick-up tube target having a transparent n-type conductive layer 12, an amorphous Se layer 13 and an $Sb_2S_3$ layer 14 sequentially stacked on a transparent glass substrate 11.

Figure 2:
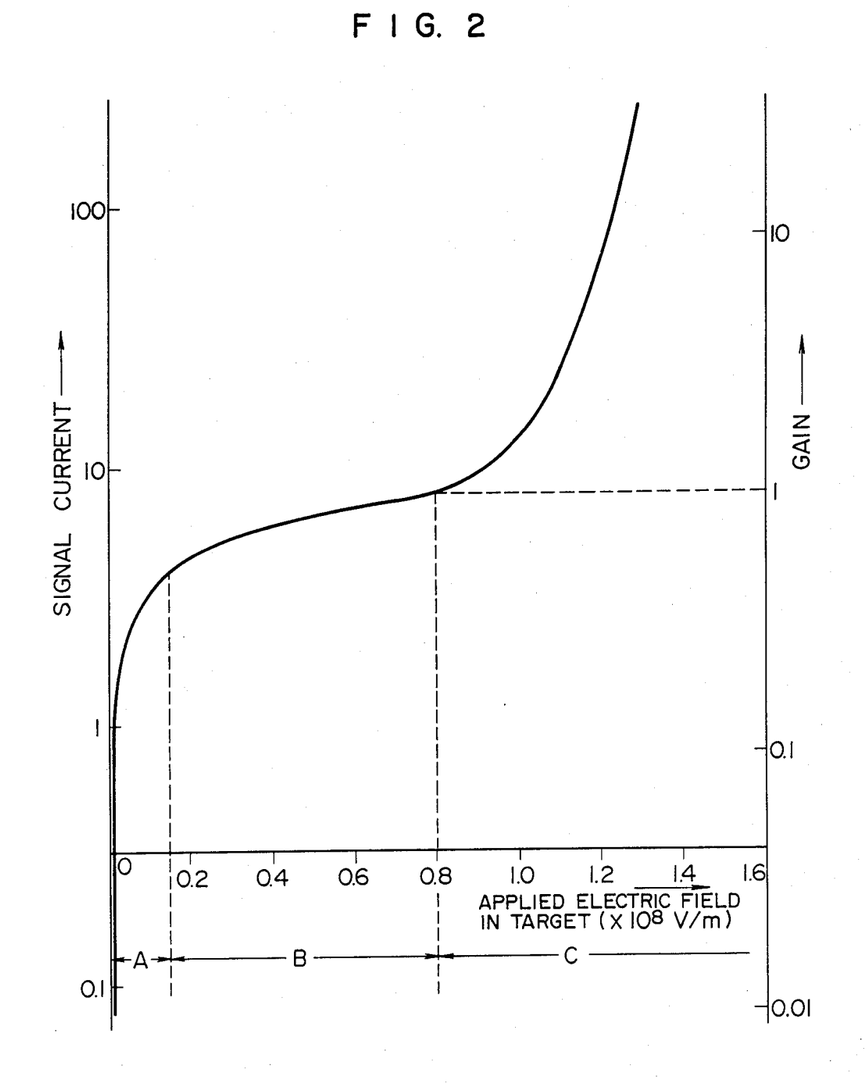
FIG. 2 shows a characteristic of an applied electric field versus a signal current of the target shown in FIG. 1.

FIG. 2 shows a relationship between an output signal current of the target and a target voltage. It shows the relationship between the output signal current (ordinate) and the applied voltage (abscissa) when the light 15 is applied under such an applied voltage that the n-type conductive layer 12 is of positive potential with respect to the $Sb_2S_3$ layer 14. The applied voltage is represented by an electric field strength.

An interface between the transparent n-type conductive layer 12 and the amorphous Se layer 13 has a rectifying function to block injection of holes, and the $Sb_2S_3$ layer 14 has a function to present the scanning electrons from flowing into the amorphous Se layer 13. Accordingly, the target of the present image pick-up tube functions as a blocking type target. As seen from FIG. 2, a characteristic of signal current versus applied voltage comprises three regions A, B and C.

In the region A, the incident light 15 is absorbed by the amorphous Se layer 13 to create electronhole pairs, a portion of which is separated by the applied voltage and the electrons are directed to the transparent n-type conductive layer 12 while the holes reach the $Sb_2S_3$ layer 14 and read by a scanning electron beam (not shown). In this electric field region, the signal current increases as the electric field increases, but since an affect by the recombination of electrons and holes is big, the gain of the target is less than unity.

When the target voltage is increased to the region B, most of the electron-hole pairs generated by the incident light are separated by the electric field and they run toward the transparent n-type conductive layer 12 and the $Sb_2S_3$ layer 14, respectively, without recombination. In this region, the signal current tends to saturate. The signal current is maximum when the incident light has been completely converted to the electron-hole pairs and taken out as the signal current. Accordingly, the gain of the target is unity at maximum. The blocking type target described in the Description of the Related Art operates in the region A or B.

Figure 3:
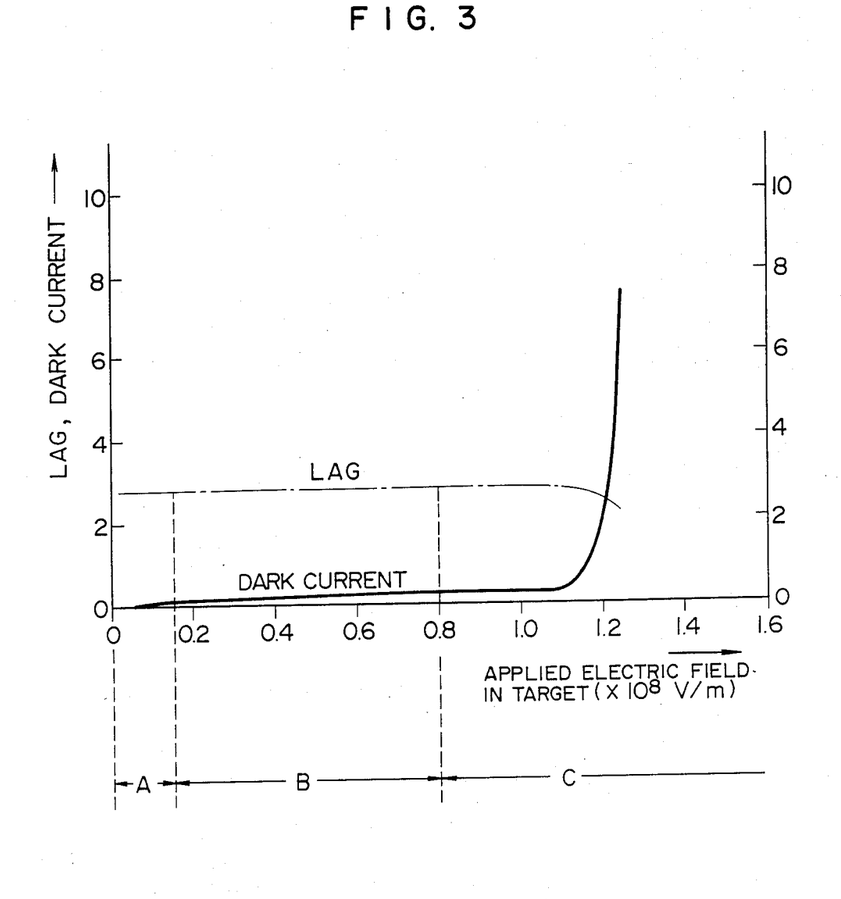
FIG. 3 shows characteristics of the applied electric field, and a lag and a dark current of the target shown in FIG. 1.

When the photo-conductive layer is mode of an amorphous semiconductor such as amorphous Se, if the target electric field is further increased from the region B, the signal current abruptly increases so that the gain increases beyond unity. FIG. 3 shows a relationship between the target electric field and the dark current and the lag. The lag in the region C in which the gain is larger than unity does not increase from the lag in the region B, and the dark current is small except in a high electric field region in the region C where the signal extremely increases. As the thickness of the amorphous Se larger increases, the multiplication factor of the signal current at the constant applied electric field strength increases. Accordingly, it is apparent that the charge multiplication function of the photo-conductive target of the present invention is not the amplification function by the charge injection described in the Description of the Related Art but it is a charge multiplication function in the amorphous Se layer which has not been known in the prior art.

The high sensitivity image pick-up tube having a larger than unity again can be provided without increasing the lag by making use of the phenomenon that the charge multiplication function takes place in the amorphous Se film when a high electric field is applied thereto and constructing the target such that the charge multiplication function is effectively created.

The high sensitivity obtained by making use of the charge multiplication function in the region C shown in FIG. 2 is very sensitive to the applied voltage, as shown from FIG. 2. After detailed analysis of the operational characteristic of the image pick-up tube target of FIG. 1, it has been provided that the multiplication factor also varies with other operational conditions than the applied voltage, such as temperature, light wavelength and operation time. Accordingly, even if the applied voltage to the target of the image pick-up tube is kept constant, a stable image signal is not always produced.

The inventors of the present invention analyzed in detail the operation of the target of the image pick-up tube which uses the charge multiplication function and found that it is very effective to control the applied voltage such that the multiplied output signal current obtained from the light of a substantially constant intensity applied to the target of the image pick-up tube separately from the object is kept constant. In this manner, the measurement light such as object image can be stably converted to an electrical signal with high reproducibility.

Figure 4:
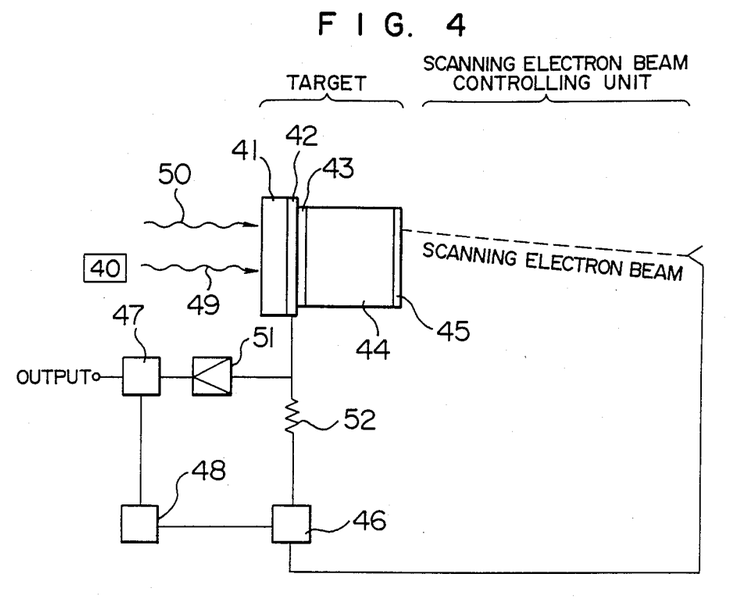
FIG. 4 shows an embodiment in which the light-detecting device of the present invention is applied to an image pick-up tube.

FIG. 4 shows a conceptual view of an embodiment of the image pick-up tube of the present invention. It comprises a target having a transparent substrate 41, a transparent conductive film 42, an amorphous Se layer 44, and an electron injection blocking layer 45, a scanning electron beam control unit for generating and controlling an electron beam to scan the target, a power supply 46 for applying an electric field to the target, signal detection means 47 for detecting an output signal current of the target, an amplifier 51, a load resistor 52, a voltage control circuit 48 for adjusting the electric field applied to the target by controlling the power supply 46, and a light source 40 for applying a light 49 of a constant intensity to the target which is a photo-electric conversion unit for obtaining a control signal to control the electric field applied to the target. The scanning electron beam control unit comprises electrodes for focusing and deflecting the electron beam and a casing which is an enclosure on which the electrodes are arranged, although they are not shown in FIG. 4. If a sufficient rectifying contact is not attained between the amorphous Se layer 44 and the transparent conductive film 42 of the target, a rectifying contact enhancement layer 43 is provided to enhance the rectifying contact function.

The power supply 46 is connected to the photo-electric conversion unit (target) of the light-detecting device (image pick-up tube) of FIG. 4 such that the transparent conductive film 42 is of positive potential relative to the electron injection blocking layer 45. An electric field corresponding to the region C of FIG. 2 is applied to the amorphous Se layer 44 of the target. Under this condition, the incident light 49 of the predetermined intensity is applied from the light source 40 to the transparent substrate 41. As a result, the incident light 49 is absorbed by the amorphous Se layer 44 of the target so that electron-hole pairs which are photo-carriers are generated. The electrons flow into the transparent conductive film 42 by the applied electric field and the holes travel in the amorphous Se layer 44 toward the electron injection blocking layer 45. When the holes travel in the amorphous Se layer 44 under the relatively high electric field, a charge multiplication function is created. Namely, the holes generate new electron-hole pairs (carriers) which generate further electron-hole pairs. Thus, if the amorphous Se layer 44 is thick enough to assure a desired characteristic, a desired charge multiplication is created and a high sensitivity image pick-up tube having a larger than unity gain is provided.

A light to be measured, that is, a measurement light 50 applied to the target from the object is photo-electric converted by the amorphous Se layer 44 as is done for the incident light 49, and the signal charges are multiplied by the charge multiplication function.

The signal current taken out of the target is amplified by an amplifier and then (or before the amplification) the output signal due to the incident light 49 is separated by the output signal detection means 47. The power supply 46 is controlled by the voltage control circuit 48 so that the magnitude of the output signal is kept constant. The signal detection means 47 determines whether the signal current from the target is due to the incident light 49 or due to the measurement light 50 by time-dividing the output signal and detecting it in synchronism with the output signal due to the incident light. The other output signal separated by the signal detection means 47, that is, the output signal due to the measurement light 50 is outputted as a normal output signal (image signal of the object).

As described above, by providing the light source 40 which generates the incident light 49 of the constant intensity and controlling the power supply 46 to feed back the output signal by the signal charges generated by the photo-electric conversion unit, by the incident light 49 from the light source 40, the measurement light 50 from the object can be converted to the electric signal with high stability and reproducibility.

In FIG. 4, the incident light 49 of the constant intensity is applied to the transparent substrate 41, although the same effect is attained when the incident light is applied in other direction, for example, from the side of the electron beam scan.

What is important here is that the intensity of the incident light 49 absorbed by the photo-electric conversion unit is constant, and the direction of the incident light is not an essential matter.

In the present embodiment, the photo-conductive layer 44 of the target of the image pick-up tube is the amorphous Se layer. It is effective to add As and/or Ge in the amorphous Se layer in order to enhance the thermal stability and to add Te in order to enhance the long wavelength sensitivity of the amorphous Se. The photo-conductive layer 44 is not necessarily a single layer of the amorphous Se semiconductor but it may be a stack of two or more amorphous semiconductor layers having charge multiplication functions similar to that of the Se layer, or a stack of a crystalline semiconductor layer and an amorphous semiconductor layer.

While the photo-conductive target has been explained, the present invention may be equally applicable to other light-detecting device such as image intensifier type image pick-up device, photo-multiplier tube or avalanche photo-diode which uses a crystalline semiconductor.

Embodiments of the present invention are explained in detail below.

EMBODIMENT 1

Figure 5:
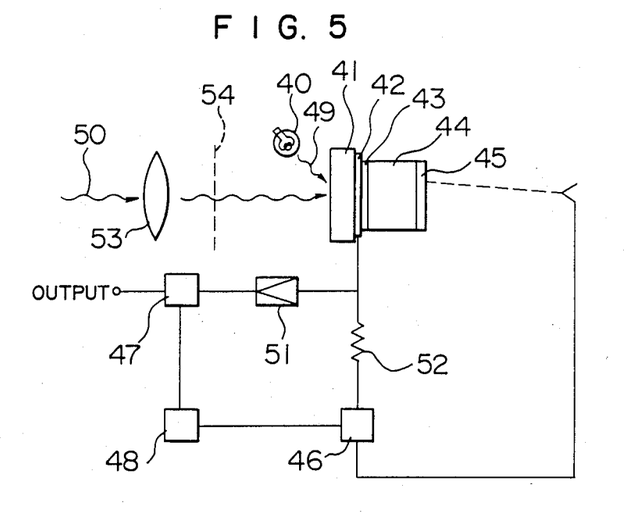
FIG. 5 shows another embodiment in which the light-detecting device of the present invention is applied to an image pick-up tube.

As shown in FIG. 5, a transparent conductive film 42 primarily consisting of indium oxide is formed on a glass substrate 41, and a $CeO_2$ hole injection blocking layer 43 having a thickness of 0.03 $\mu$m and an amorphous semiconductor layer 44 primarily consisting of Se and having a thickness of 0.5–6 $\mu$m are sequentially formed on the transparent conductive film 42 by a vacuum vapor deposition method. An $Sb_2S_3$ layer having a thickness of 0.1 $\mu$m which acts as an electron injection blocking layer 45 is vapor deposited on the amorphous semiconductor layer in an inert gas environment of $2 \times 10^{-1}$ Torr to form a blocking type photo-conductive image pick-up tube target. The target is then incorporated in the image pick-up tube having which contains an electron gun to form the photo-conductive image pick-up tube.

An electric field of $8 \times 10^7$ V/m or higher is applied to the image pick-up tube by the arrangement shown in FIG. 5, that is, by the power supply 46 with the conductive film 42 being more positive than the electron injection blocking layer 45. Under this condition, the charges are multiplied in the amorphous semiconductor layer. A shutter 54 is then closed while the incident light 49 of the constant intensity is applied. The shutter blocks the lights other than the incident light 49 from the light source 40 to prevent such lights from being absorbed by the amorphous Se layer 44 which is the photo-conductive layer in the target. Then, the switch 47 which is output signal detection means is actuated to supply the signal current corresponding to the incident light 49 to the voltage control circuit 48 to control the power supply 46 such that a gain to the incident light 49 is set to 10, for example. Then, the shutter 54 is applied to apply the light 50 from the object (measurement light) to the image pick-up tube and the switch 13 is actuated to supply the output current for the measurement light 50 to an output terminal. By carrying out the above operation from time to time as required, the object image can be picked up at a high sensitivity with stable gain and high reproducibility.

EMBODIMENT 2

Figure 6A:
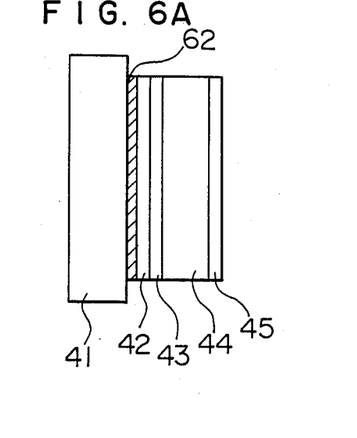
FIGS. 6A, 6B and 6C show structures of targets in an embodiment of FIG. 7 in which the light-detecting device of the present invention is applied to an image pick-up tube.
Figure 6B:
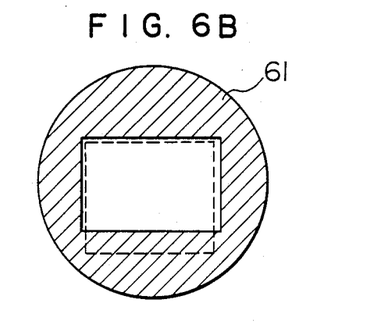
Figure 6C:
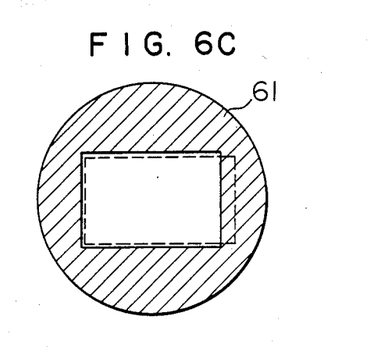

Reference is made to FIGS. 6A, 6B, 6C and 7. A Cr masking film 62 is deposited on a transparent substrate 41 such as glass substrate by a vacuum vapor deposition method. An opening shown in FIGS. 6B and 6C is formed on the substrate 41 by masking. A batched area 61 blocks a light. A transparent conductive film 42 primarily consisting of indium oxide is formed thereon. A hole injection blocking layer 43, a photo-conductive layer 44 and an electron injection blocking layer 45 are sequentially formed in the same method as that used in the Embodiment 1 to form a photo-conductive image pick-up tube target. The target is then incorporated into a housing in which a scanning electron beam unit is arranged to form the image pick-up tube.

Figure 7:
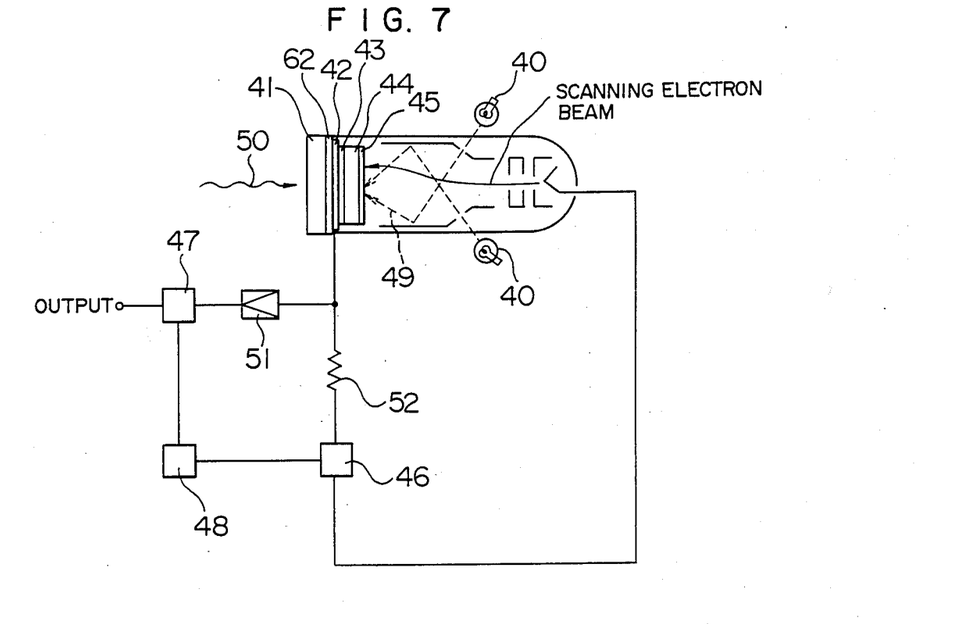
FIG. 7 shows a further embodiment in which the light-detecting device of the present invention is applied to an image pick-up tube.

A target electric field of $8 \times 10^7$ V/m or higher is applied to the image pick-up tube by an arrangement shown in FIG. 7. In the present embodiment, the incident light 49 is applied to the target from the side of the scanning electron beam. If the portion of the target corresponding to the broken line area shown in FIG. 6B and 6C is scanned by the electron beam, a multiplied combined signal current to the measurement light 50 and the incident light 49 of the constant intensity is produced. When the scanning electron beam scans the area corresponding to the opening in the broken line area, a signal current for the measurement light 50 is produced, and when the scanning electron beam scans the area corresponding to the hatched area in the broken line area, the measurement light 50 does not go into the photo-conductive layer 44 by the masking film 42 shown in FIG. 6A and the signal current is produced only based on the incident light 49 from the light source 40. The combined signal current is time-sequentially divided into signal current components for the incident light 49 and the measurement light 50 by the detection circuit 47 which is the output signal detection means. The power supply 46 is controlled by the signal current for the incident light 49 through the voltage control circuit 48, or it is automatically controlled so that the signal current for the incident light 49 is always kept constant. In this manner, the object image can be picked up at a high sensitivity with high stability and high reproducibility.

EMBODIMENT 3

Figure 8:
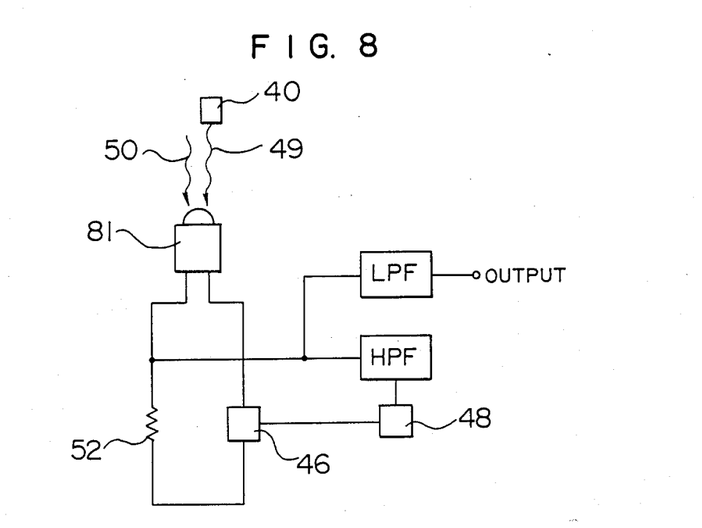
FIG. 8 shows an embodiment in which the light-detecting device of the present invention is applied to an APD.

FIG. 8 shows an embodiment in which the light-detecting device of the present invention is applied to an avalanche diode. An RF continuous pulse light having constant intensity and frequency is applied, as an incident light 49, to an avalanche diode 81 from a light source 40 such as semiconductor laser. A period of the pulse is sufficiently larger than a period of the measurement light. Only the multiplied output current component for the continuous pulse light 49 is separated by a high-pass filter which is the signal detection means and the power supply 46 is controlled by the voltage control circuit 48 such that the signal current is always kept constant. In this manner, the signal current for the measurement light 50 can be produced through a low-pass filter with high stability and reproducibility.

In the embodiments described above, the output signal at the output terminal is either by the measurement light only or by the combination of the measurement light and the incident light. They may be selected depending on whether they are appropriate to the light-detecting device and they are not essential matter of the present invention.

We claim:

1. A light-detecting device comprising:
a photo-electric conversion unit for converting a light to a charge;
a power supply for applying an electric field to the photo-electric conversion unit;
a light source for applying an incident light to the photo-electric conversion unit;
means for applying also a measurement light from an object to said photo-electric conversion unit;
a signal detection means for detecting a charge corresponding to the incident light from the light source converted by the photo-electric conversion unit; and
a signal hold means for controlling the power supply to adjust the electric field applied to the photo-electric conversion unit in order to hold an output signal of the signal detection means at a predetermined level.

2. A light-detecting device according to claim 1, wherein said photo-electric conversion unit includes a substrate, a conductive film formed thereon and a photo-conductive layer formed on the conductive film for converting a measurement light to an electrical signal.

3. A light-detecting device according to claim 1 wherein said photo-electric conversion unit multiplies the charge generated by the photo-electric conversion.

4. A light-detecting device according to claim 1 wherein the incident light is of essentially constant intensity and the source is provided within the device.

5. A light-detecting device according to claim 4 wherein the incident light is a pulse light of a constant frequency.

6. A light-detecting device according to claim 1 wherein said incident light source is a tungsten lamp located within the device.

7. A light-detecting device according to claim 1 wherein said incident light source is a semiconductor laser located within the device.

8. The light-detecting device as set forth in claim 1 wherein the means for applying is a shutter applying the measurement light to the photo-electric conversion unit.

9. A light-detecting device a photo-electric conversion unit for converting a light to a charge, said photo-electric conversion unit
including a substrate, a conductive film formed thereon and a photo-conductive layer formed on the conductive film for converting a measurement light to an electrical signal;
a power supply for applying an electric field to the photo-electric conversion unit;
a light source for applying an incident light to the photo-electric conversion unit;
a signal detection means for detecting a charge corresponding to the incident light from the light source converted by the photo-electric conversion unit; and
a signal hold means for controlling the power supply to adjust the electric field applied to the photo-electric conversion unit in order to hold an output signal of the signal detection means at a predetermined level;
wherein said photo-conductive layer has a first charge injection blocking layer for blocking injection of a first charge formed thereon.

10. A light-detecting device according to claim 9 wherein said photo-conductive layer is made of an amorphous semiconductor having a charge multiplication ability.

11. A light-detecting device according to claim 10 wherein said amorphous semiconductor primarily consists of Se.

12. A light-detecting device according to claim 11 wherein said amorphous semiconductor contains at least one element selected from an element group consisting of As and Ge.

13. A light-detecting device according to claim 11 wherein said amorphous semiconductor contains Te.

14. A light-detecting device a photo-electric conversion unit for converting a light to a charge, said photo-electric conversion unit including a substrate, a conductive film formed thereon and a photo-conductive layer formed on the conductive film for converting a measurement light to an electrical signal;

a power supply for applying an electric field to the photo-electric conversion unit;

a light source for applying an incident light to the photo-electric conversion unit;

a signal detection means for detecting a charge corresponding to the incident light from the light source converted by the photo-electric conversion unit; and a signal hold means for controlling the power supply to adjust the electric field applied to the photo-electric conversion unit in order to hold an output signal of the signal detection means at a predetermined level;

wherein a second charge injection blocking layer for blocking injection of a second charge is formed between said conductive film and said photo-conductive layer.

15. A light-detecting device comprising:

an image pick-up-tube including a photo-electric conversion unit for photo-electrically converting an external measurement light to an electrical signal, a scanning electron beam unit for generating and scanning a scanning electron beam to time-serially reading a charge generated by said photo-electric conversion unit and a housing for accommodating said photo-electric conversion unit and said scanning electron beam unit;

said image pick-up tube including a transparent substrate, a transparent conductive film formed on said transparent substrate and a photo-conductive layer formed on said transparent conductive film, for multiplying the charge generated for the measurement light by an electric field applied to said photo-conductive layer;

a power supply connected between said transparent conductive film of said image pick-up tube and said scanning electron beam unit for applying the electric field to said photo-conductive layer;

a light source for applying an incident light to said photo-electric conversion unit;

signal detection means connected to said transparent conductive film to detect a signal produced by said photo-electric conversion unit by the incident light applied from said light source; and signal hold means for controlling said power supply to adjust the electric field applied to said photo-conductive layer in order to hold the output signal from said signal detection means at a constant level.

16. A light-detecting device according to claim 15 wherein said photo-electric conversion unit includes a masking film having an opening between said transparent substrate and said transparent conductive film, said light source applies the incident light to said photo-electric conversion unit from the opposite side to the incident side of the measurement light, a scan area of the electron beam scanned by said scanning electron beam unit partially coincides with the shape of the opening so that the output signal for the incident light is time-serially included in the output signal from said image pick-up tube, and said signal detection means detects the output signal for the incident light in synchronism with the output signal of said image pick-up tube.

17. A light-detecting device according to claim 15 wherein said amorphous semiconductor primarily consists of Se.

18. A light-detecting device according to claim 15 wherein said amorphous semiconductor contains at least one element selected from an element group consisting of As and Ge.

19. A light detecting device according to claim 15 wherein said amorphous semiconductor contains Te.

20. A light-detecting device according to claim 17 wherein an intensity of the electric field applied to said photo-conductive layer is $8 \times 10^7$ V/m or higher.

21. A light-detecting device according to claim 15 wherein the incident light is a pulse light having an essentially constant intensity and an essentially constant period, and said signal detection means is a filter for frequency-selectively detecting the output signal produced by the incident light from the output signal of said photo-electric conversion unit.

22. A light-detecting device according to claim 21 wherein the incident light is an RF continuous pulse light from a semiconductor laser and said filter is a high-pass filter.

23. A light-detecting device for converting light from an object into electric signal comprising:

a photo-electric conversion unit for converting light into charges;

a scanning electron beam unit for generating and scanning a scanning electron beam to time-serially reading charges generated by the unit;

a power supply for applying an electric field to the unit;

a light source for applying an incident light to the unit, the incident light is applied to the unit from the side of the scanning electron beam;

a signal detection means for detecting charges corresponding to the incident light from the light source converted by the unit; and a signal hold means for controlling the power supply to adjust the electric field applied to the unit so as to hold an output signal of the signal detection means at a predetermined level.

* * * * *

UNITED STATES PATENT AND TRADEMARK OFFICE
CERTIFICATE OF CORRECTION

PATENT NO. : 4,884,011

DATED : November 28, 1989

INVENTOR(S) : Tatsuo Makishima, et al.

It is certified that error appears in the above-identified patent and that said Letters Patent is hereby corrected as shown below:

On the Title page, at [73] Assignee, "Nippon Hoso Kasai" should read --Nippon Hoso Kyokai--.

Signed and Sealed this

Eleventh Day of June, 1991

*Attest:*

HARRY F. MANBECK, JR.

*Attesting Officer*     *Commissioner of Patents and Trademarks*